United States Patent
Hundley et al.

(10) Patent No.: US 11,079,683 B2
(45) Date of Patent: Aug. 3, 2021

(54) APERTURE SYSTEM FOR PRECERAMIC POLYMER STEREOLITHOGRAPHY

(71) Applicant: HRL LABORATORIES, LLC, Malibu, CA (US)

(72) Inventors: Jacob M. Hundley, Newbury Park, CA (US); Zak C. Eckel, Thousand Oaks, CA (US); Emily C. Schueller, Santa Barbara, CA (US); Scott M. Biesboer, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 452 days.

(21) Appl. No.: 15/606,861

(22) Filed: May 26, 2017

(65) Prior Publication Data
US 2018/0341184 A1    Nov. 29, 2018

(51) Int. Cl.
*G03F 7/20* (2006.01)
*B29C 37/00* (2006.01)
(Continued)

(52) U.S. Cl.
CPC ...... *G03F 7/70416* (2013.01); *B29C 35/0888* (2013.01); *B29C 37/0075* (2013.01);
(Continued)

(58) Field of Classification Search
CPC ... G03F 7/70416; G03F 7/0037; B33Y 40/00; B33Y 30/00; B29C 64/135; B29C 35/0888; B29C 37/0075; B29C 2035/0827
See application file for complete search history.

(56) References Cited

U.S. PATENT DOCUMENTS

| | | | |
|---|---|---|---|
| 4,839,206 A | * | 6/1989 | Waldenberger ............ C09J 7/38 428/41.5 |
| 7,438,846 B2 | | 10/2008 | John |

(Continued)

FOREIGN PATENT DOCUMENTS

| | | |
|---|---|---|
| CN | 106466918 A | 3/2017 |
| CN | 104416908 B | 4/2017 |
| WO | WO2016149104 A1 | 9/2016 |

OTHER PUBLICATIONS

Definition of "Aperture" from Merriam-Webster On-line Dictionary (copyright 2019).*

(Continued)

*Primary Examiner* — Christopher T Schatz
*Assistant Examiner* — Cynthia L Schaller
(74) *Attorney, Agent, or Firm* — Lewis Roca Rothgerber Christie, LLP

(57) ABSTRACT

An aperture system for a bottom-up stereolithography device including a reservoir having a lower opening, an aperture including a flexible membrane positioned within the reservoir and covering the lower opening, and a boundary seal positioned around a periphery of the flexible membrane, the boundary seal including one or more boundary seal components and immobilizing the periphery of the flexible membrane against the reservoir. The flexible membrane is formed of a material having a low affinity for a liquid resin used in the stereolithography device as well as cured photopolymer resin parts produced by the device. In addition, the flexible membrane is able to deform as the cured resin part is pulled away from the aperture, thus enabling lower energy mixed mode adhesive failure to occur at the interface between the cured resin and the aperture and reducing the chance of cohesive damage to the cured photopolymer part.

18 Claims, 12 Drawing Sheets

(51) Int. Cl.
  *B33Y 40/00* (2020.01)
  *B29C 64/135* (2017.01)
  *B29C 35/08* (2006.01)
  *B33Y 30/00* (2015.01)
  *G03F 7/00* (2006.01)

(52) U.S. Cl.
  CPC ............ *B29C 64/135* (2017.08); *B33Y 30/00* (2014.12); *B33Y 40/00* (2014.12); *G03F 7/0037* (2013.01); *B29C 2035/0827* (2013.01)

(56) References Cited

U.S. PATENT DOCUMENTS

| | | | |
|---|---|---|---|
| 9,452,567 B2 | 9/2016 | Syao | |
| 2011/0089610 A1* | 4/2011 | El-Siblani | B29C 33/44 264/401 |
| 2012/0195994 A1* | 8/2012 | El-Siblani | B33Y 10/00 425/174.4 |
| 2012/0328726 A1 | 12/2012 | Zenere | |
| 2013/0270746 A1* | 10/2013 | Elsey | B29C 35/0805 264/447 |
| 2013/0295212 A1 | 11/2013 | Chen et al. | |
| 2014/0084517 A1* | 3/2014 | Sperry | B29C 67/0077 264/406 |
| 2014/0191442 A1 | 7/2014 | Elsey | |
| 2015/0056320 A1 | 2/2015 | Costabeber | |
| 2015/0064298 A1 | 3/2015 | Syao | |
| 2015/0183168 A1* | 7/2015 | Liverman | B29C 64/386 264/401 |
| 2017/0050389 A1* | 2/2017 | Lee | B33Y 30/00 |
| 2017/0246797 A1* | 8/2017 | Lambrecht | B29C 31/02 |
| 2017/0326787 A1* | 11/2017 | Wattyn | B33Y 30/00 |
| 2018/0029296 A1* | 2/2018 | Van Esbroeck | B29C 64/255 |

OTHER PUBLICATIONS

International Search Report and Written Opinion for corresponding PCT Application No. PCT/US2017/046609, dated Jan. 22, 2018 (12 pages).
Extended European Search Report dated Jan. 28, 2021, issued in in corresponding EP Application No. 17910681.0, 8 pages.
State Intellectual Property Office action dated Feb. 26, 2021, issued in Chinese Patent Application No. 201780091229.2, with English translation.
Extended European Search Report dated Jan. 28, 2021, issued in EP Application No. 171910681.

* cited by examiner

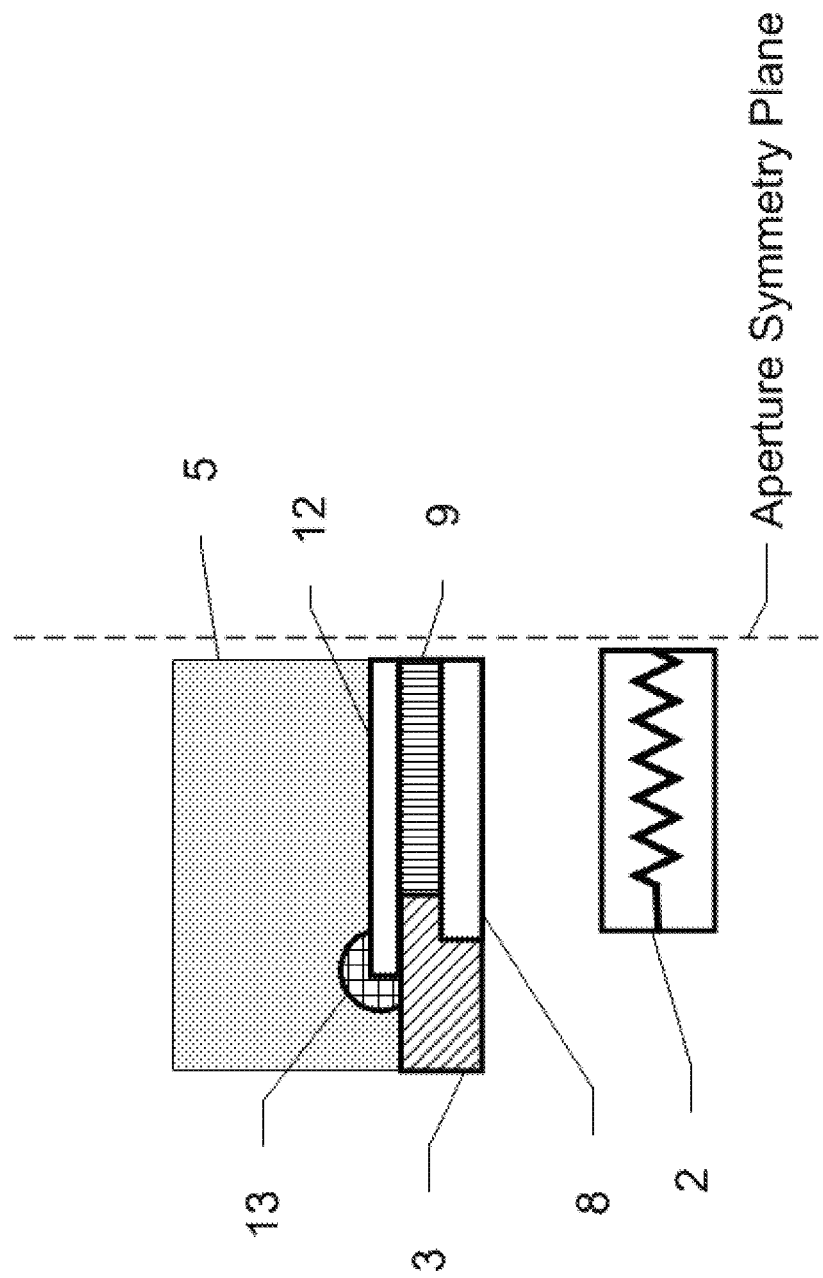

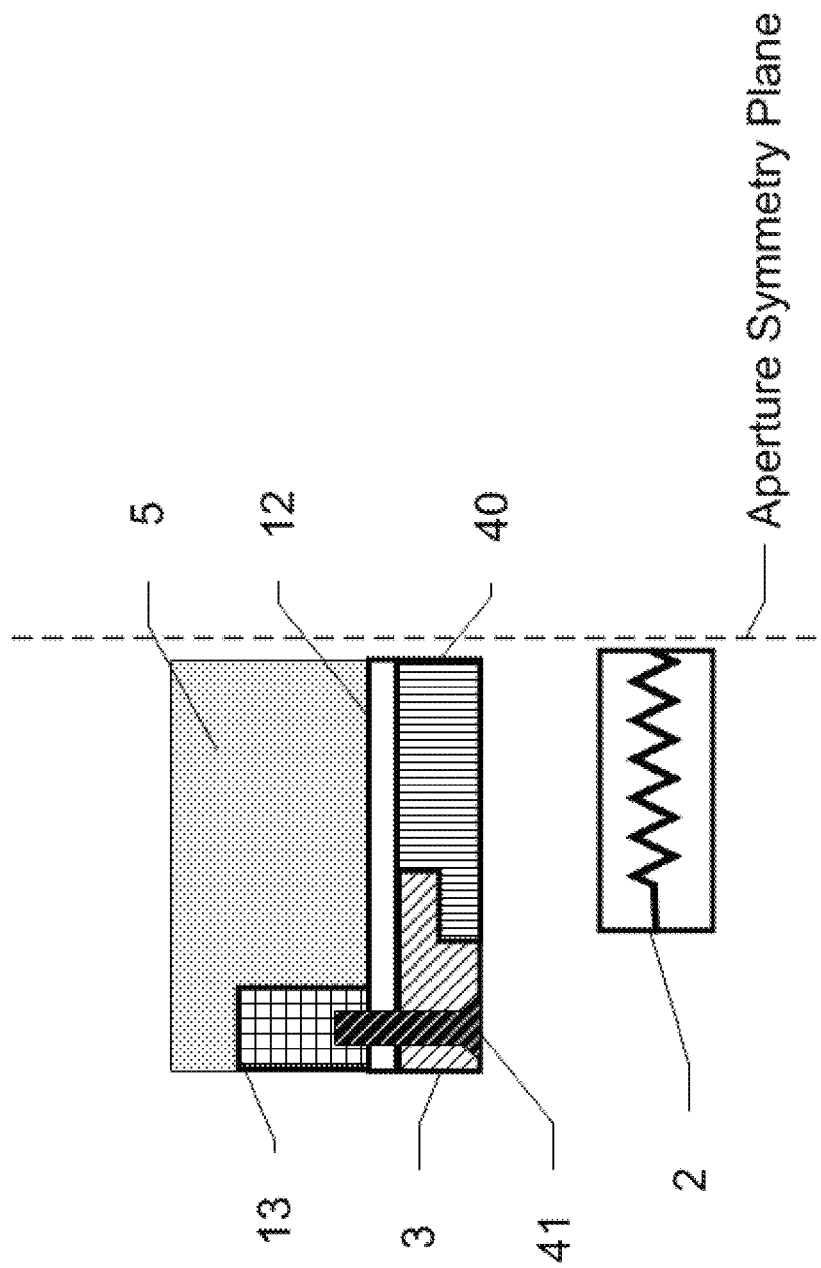

APERTURE SYSTEM FOR PRECERAMIC POLYMER STEREOLITHOGRAPHY

FIELD

The present disclosure relates generally to polymer stereolithography, and more specifically to an aperture system and device for stereolithography of polymers with high inorganic content.

BACKGROUND

Additive manufacturing (AM) using stereolithography or three-dimensional (3D) printing of photopolymer resins is of widespread interest as a method of producing structures or parts with complex geometries. These methods typically form a structure by sequentially depositing multiple layers or cross-sections of material in a vertical stack until a desired height and form are achieved.

In stereolithography, layers of solid material are typically formed by polymerizing corresponding liquid photopolymer resin layers held within a reservoir. The controlled transformation of such liquid to solid layers may be accomplished by exposing the resin to a radiation source (e.g. digital projector, laser, LED) capable of curing the resin, e.g., by initiating one or more polymerization reactions in the resin. The volume of liquid photopolymer resin positioned between the radiation source and the surface of a build platform or previously deposited layer polymerizes upon radiation exposure, thus forming a new layer of solid resin. The layers are stacked during polymerization to thereby form a three-dimensional solid material.

In a bottom up stereolithography approach, the liquid photopolymer resin held in the reservoir is exposed to a radiation source through a transparent aperture positioned in the bottom of the reservoir. A build platform or previously deposited layer of material is positioned at a pre-set distance from the aperture, and a layer of solid resin is created between the aperture and the bottom surface of the platform or part. The new solid layer is formed so that it directly contacts (e.g., is in direct contact with) the aperture at the bottom of the reservoir. The new solid layer is subsequently separated from the aperture, and the layer deposition process may be repeated.

The aperture used in a bottom-up stereolithography device typically includes a durable, transparent window made of a material such as glass, polyethylene terephthalate (PET), and/or poly(methyl methacrylate) (PMMA). However, these materials have high hardness values and may readily adhere to any cured resin that is directly deposited on the window. This adherence between the cured resin and the window may prevent or impede removal of the cured photopolymer part, thus prematurely halting or slowing the deposition process. Accordingly, the aperture of a bottom up stereolithography device may further include a compliant release layer positioned between the window and the resin to reduce adhesive bonding between the resin and the window, thereby avoiding or reducing damage associated with removal of adhered resin. Such compliant release layers are necessarily transparent to the radiation source, and often include silicones or fluorinated polymers.

However, such silicon- or fluorine-containing compliant release layers may be incompatible with high inorganic content preceramic photopolymer resins (such as silicon-containing photopolymer resins), which are desired for manufacturing of ceramic parts. Specifically, the silicon- or fluorine-containing compliant release layers may adhere strongly to the parts made of cured high inorganic content preceramic resin, thereby causing damage such as breaking or cracking in the cured part when force is applied to separate the part from the aperture. Accordingly, the use of high inorganic content preceramic photopolymer resins in additive manufacturing has been limited.

SUMMARY

Aspects of embodiments of the present disclosure are directed toward a structure to be used in bottom-up stereolithography systems for additive manufacturing of photopolymer resins with high inorganic content.

Additional aspects will be set forth in part in the description which follows, and, in part, will be apparent from the description, or may be learned by practice of the presented embodiments.

According to embodiments of the present disclosure, an aperture for bottom-up stereolithography devices includes a reservoir having a lower opening; an aperture, the aperture including a flexible membrane positioned within the reservoir and covering the lower opening; and a boundary seal positioned around a periphery of the flexible membrane, the boundary seal comprising one or more boundary seal components and immobilizing the periphery of the flexible membrane against the reservoir.

The aperture may further include a transparent window under the flexible membrane and in the lower opening of the reservoir, the transparent window covering the lower opening; and a compliant release layer between the transparent window and the flexible membrane in the lower opening of the reservoir, the compliant release layer covering the lower opening and having a low affinity for the flexible membrane.

The flexible membrane may be configured to have a contact angle greater than about 40° with a resin used for stereolithography.

The flexible membrane may be configured to have an interlayer peel strength of less than about 200 N/m with a cured photopolymer resin part.

The flexible membrane may include polystyrene (PS), polymethylpentene (PMP), cyclic olefin copolymers (COC), fluorinated ethylene propylene (FEP), perfluoroalkoxyalkane (PFA), polytetrafluoroethylene (PTFE), or a mixture thereof.

The flexible membrane may have a thickness of about 10 µm to about 750 µm.

The boundary seal components may include a reversible mechanical attachment.

The reversible mechanical attachment may include a magnet having a magnetic force of about 5 lbs. to about 60 lbs.

The boundary seal components may include an epoxy adhesive, an acrylate adhesive, a silicone sealant, a urethane sealant, or a mixture thereof.

The boundary seal components may include a vacuum chuck to maintain contact between the flexible membrane and the reservoir wall.

The boundary seal may extend to a height greater than the aperture within the reservoir and comprises a resin exchange feature.

The transparent window may include glass, polyethylene terephthalate (PET), biaxially-oriented polyethylene terephthalate (BOPET), polymethylpentene (PMP), cyclic olefin copolymers (COC), polycarbonate, polymethylmethacrylate (PMMA), or a mixture thereof.

The transparent window may have a thickness of about 0.1 mm to about 16 mm.

The compliant release layer may include silicone, urethane, fluorinated polymers, or a mixture thereof.

The compliant release layer may be a gas or fluid, the gas or fluid including air, water, an alcohol, an oil, a resin without a photoinitiator component, or a mixture thereof.

The compliant release layer may have a thickness of about 0.1 mm to about 13 mm.

The aperture may further include a transparent window under the flexible membrane, wherein the flexible membrane and the transparent window are integrated and included in the lower opening as a single body without a compliant release layer therebetween.

The flexible membrane may be suspended above an exposure source under tension without a compliant release layer or a window under the flexible membrane.

The aperture may further include a volume of gas or liquid between the flexible membrane and the compliant release layer. The gas or liquid between the flexible membrane and the compliant release layer may include air, water, an alcohol, an oil, a resin without a photoinitiator component, or a mixture thereof.

The compliant release layer and the transparent window may be integrated and included in the aperture as a single body.

According to embodiments of the present disclosure, a stereolithography device includes: a build platform; a reservoir positioned below the build platform so that the build platform can be lowered into or raised out of the reservoir; an aperture positioned within and covering at least a portion of a bottom of the reservoir; and an exposure source positioned below the reservoir and configured to emit a light that passes through the aperture; wherein the aperture includes a flexible membrane and a boundary seal positioned around a periphery of the flexible membrane, the boundary seal comprising one or more boundary seal components and immobilizing the periphery of the flexible membrane against the reservoir. The aperture may further include one or more of the following: a transparent window under the flexible membrane and in the lower opening of the reservoir, the transparent window covering the lower opening; and a compliant release layer between the transparent window and the flexible membrane in the lower opening of the reservoir, the compliant release layer covering the lower opening and having a low affinity for the flexible membrane.

BRIEF DESCRIPTION OF THE DRAWINGS

These and other features and advantages of embodiments of the present disclosure will become more apparent by reference to the following detailed description when considered in conjunction with the following drawings, in which:

FIG. 10 is a partial schematic cross-sectional view of an example aperture system including a permanent sealant as a boundary seal, in which the upper surface of the aperture shown in FIG. 3 is flush with the lower boundary of the liquid photopolymer resin reservoir, according to embodiments of the present disclosure; and FIG. 11 is a partial schematic cross-sectional view of an example aperture system in which the compliant release layer and the transparent window are combined into a compliant window that is held in place with the flexible membrane by a mechanical attachment boundary seal, according to embodiments of the present disclosure.

DETAILED DESCRIPTION

Figure 1:
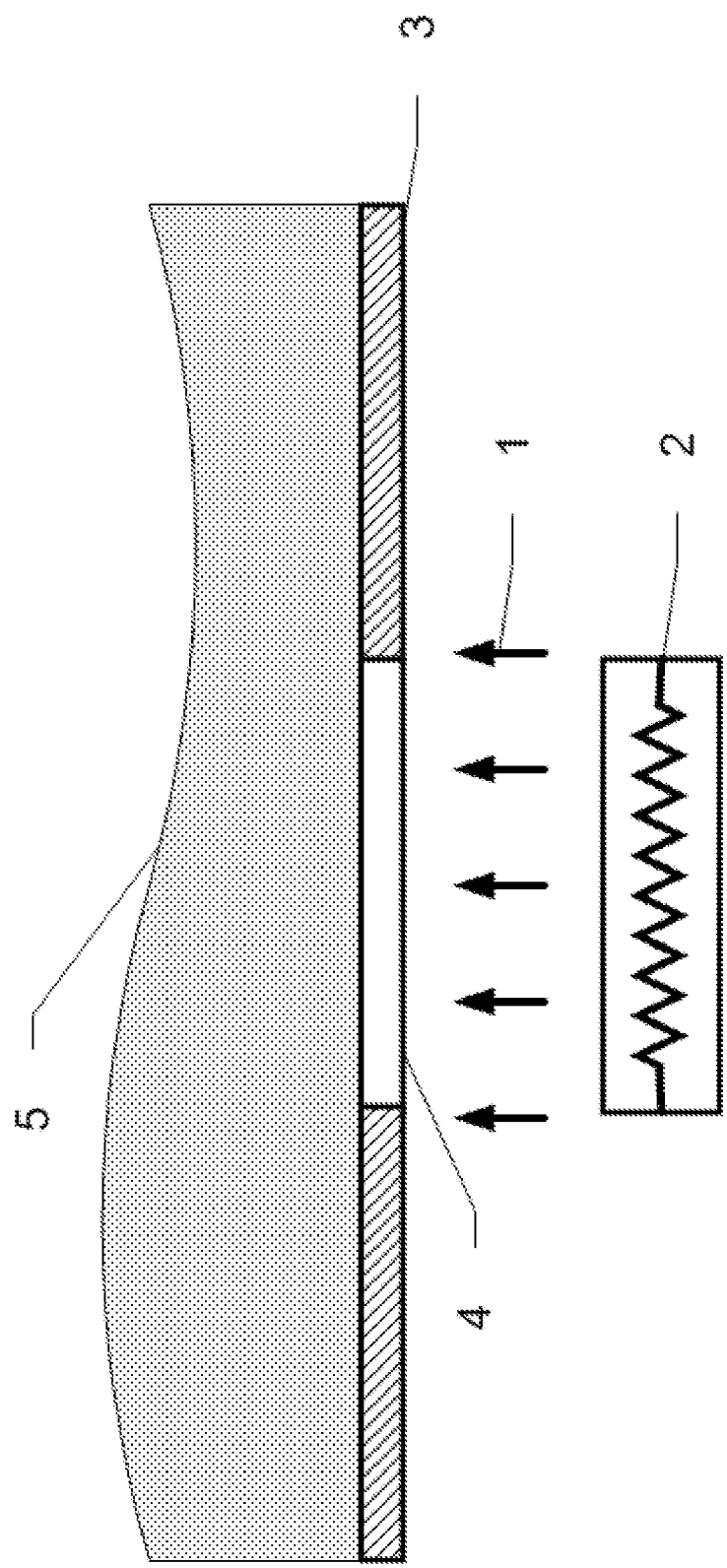
FIG. 1 is a schematic cross-sectional view of a simplified bottom-up stereolithography apparatus, in which a reservoir containing liquid photopolymer resin is exposed to a light output via a transparent window on the bottom of the reservoir.

In the following detailed description, only certain example embodiments of the subject matter of the present disclosure are shown and described, by way of illustration. As those skilled in the art would recognize, the subject matter of the present disclosure may be embodied in many different forms and should not be construed as being limited to the embodiments set forth herein.

In the context of the present application, when a first element is referred to as being "on", "coupled to", or "connected to" a second element, it can be directly on, directly coupled to, or directly connected to the second element, or be indirectly on, indirectly coupled to, or indirectly connected to the second element with one or more intervening elements interposed therebetween. Like reference numerals designate like elements throughout the specification. The thicknesses of layers, films, panels, regions, etc., may be exaggerated in the drawings for clarity. The drawings are not necessarily drawn to scale.

Aspects of embodiments of the present disclosure are directed toward an aperture system and a device including the aperture system to be used in stereolithography of photopolymer resins, including high inorganic content preceramic photopolymer resins. In some embodiments, the aperture system may be included in any commercially available bottom-up stereolithography device to improve the device's versatility and compatibility with high inorganic content preceramic photopolymer resins.

As used herein, the term "photopolymer resin" may refer to: 1) a liquid solution or mixture including one or more monomers, oligomers, and/or crosslinkers that may be polymerized or "cured" to form a solid polymer network upon exposure to light radiation of a suitable wavelength (e.g., UV light); and/or 2) a solid or semi-solid product formed upon polymerization or partial polymerization of the liquid solution or mixture including one or more monomers, oligomers, and/or crosslinkers. In the context of additive manufacturing via stereolithography and/or 3D printing, the liquid, uncured "photopolymer resin" may also be referred to as a "photopolymer ink". Terms such as "cured resin" and "cured photopolymer", etc. may be interchangeably used herein to refer to the solid polymer or printed structure, and to distinguish the cured solid polymer/structure from the liquid, uncured photopolymer resin or ink. However, it will be understood that references to the photopolymer resin, cured resin, or simply the/a "resin" may encompass one or both of the cured and uncured states, and a person of skill in the art is capable of determining the relevant state(s) of the material based on context.

As used herein, the term "preceramic" refers to a material that can be heated, pyrolyzed, and/or oxidized at an elevated temperature (e.g., above 200° C., for example about 200° C. to about 1,000° C., or about 500° C. to about 1,000° C.) to thereby produce a ceramic material. As used herein, the term "ceramic" refers to an inorganic (e.g., non-organic) and non-metallic solid comprising a network of metal, non-metal, and/or metalloid atoms held together via ionic and/or covalent bonds. Ceramic materials may be crystalline, semi-crystalline, or amorphous. Non-limiting examples of ceramic materials include metal oxides, boride, carbides, and nitrides, such as silicon carbide, silicon nitride, zirconium oxide, and/or the like.

As used herein to describe a photopolymer resin, the term "high inorganic content" refers to a preceramic material including inorganic atoms, at least a portion of which may be retained upon conversion of the preceramic material to a ceramic material. In some embodiments, greater than about 40% of the mass of the preceramic material may be inorganic and retained upon conversion, for example, about 45% to about 95%, or about 55% to about 80%. In some embodiments, the inorganic content may include silicon (Si) atoms, for example, when the preceramic photopolymer resin or one of its components is based on a derivative of siloxane, silazane, carbosilane, etc., and/or when the preceramic is used to produce a ceramic material such as silicon carbide (SiC), silicon carbonitride (SiCN), silicon oxycarbide (SiOC), silicon oxycarbonitride (SiOCN), silicon carboboride (SiCB), etc. However, embodiments of the present disclosure are not limited thereto, and other suitable photopolymer resin compositions, e.g., compositions including other inorganic atoms in addition to or in place of Si, are expressly included within the scope of the present disclosure.

In some embodiments, the inorganic content may be present as a major component or as a primary component. As used herein, the term "major component" refers to a component that is present in a composition, polymer, or product in an amount greater than an amount of any other single component in the composition or product. In contrast, the term "primary component" refers to a component that makes up at least 50% (wt % or at %) or more of the composition, polymer, or product. However, it will be understood that the Si component may be included in any amount; for example, as a minor component (e.g., in an amount less than that of other materials included in the component), and the practical definition of "high" refers to any amount of inorganic material that causes the photopolymer resin or cured resin to detrimentally adhere to a compliant release layer including silicone-based or fluorinated materials, as will be described herein.

In stereolithography and 3D printing, parts are manufactured via layer by layer deposition of a material on a build platform. In stereolithography, the material to be deposited is typically employed as a reservoir of liquid photopolymer resin. Thin layers of the liquid photopolymer resin may be polymerized (e.g., cured) and deposited on the build platform when the liquid resin is exposed to radiation (e.g., light) having a suitable wavelength, for example, UV light. Stereolithography systems can be classified as top-down or bottom-up systems, depending on whether the exposure source is applied from above or below the reservoir, respectively. When the stereolithography system is a bottom-up system, the reservoir should include a transparent aperture to allow the radiation (light) to be transmitted into the liquid photopolymer resin.

As used herein, the term "transparent" refers to an ability to transmit radiation (e.g., light) without detrimental amounts of absorption or scattering, and in this context may specifically refer to light having a wavelength in the ultraviolet (UV) range, e.g., between about 200 nm to about 460 nm. The term may refer to transmission of any wavelength (e.g., all wavelengths) falling in this range, or at least one discrete wavelength within the range. However, embodiments of the present disclosure are not limited thereto, and it will be understood that a person of ordinary skill in the art should be able to select other suitable radiation sources, wavelengths, and transparency characteristics according to the principles described herein.

As used herein, the term "aperture" may refer to a group of one or more components positioned between the photopolymer resin and the exposure source that facilitate transmission of light output into the photopolymer resin, whereas the term "aperture system" may include additional parts that do not directly participate in light transmission, but may provide other features such as physical support for the parts that directly participate in light transmission. The aperture or aperture system, as well one or more parts included therein, may be transparent to allow transmission of light into the photopolymer resin, even when not explicitly described as being transparent.

FIG. 1 shows a schematic cross-sectional view of a simplified bottom-up stereolithography system. The system uses an ultraviolet (UV) light output 1 as the polymerizing radiation, which is produced by an exposure source 2 located below an opaque reservoir 3. The light output is transmitted through a transparent aperture 4 into a liquid photopolymer resin 5 held within the opaque reservoir so that a layer of the resin adjacent to the aperture may be cured. The aperture may include one or more layers, pieces, or parts, and in some embodiments, may be capable of disassembly and/or may include disposable and/or replaceable parts, as described below.

In FIG. 1 and the remaining drawings, the entire cross-section of the reservoir 3 is not fully depicted. Instead, the drawings show only a portion of the bottom floor surrounding the aperture system. However, it will be understood that the reservoir may have any suitable shape, volume, floor area, wall height, etc., as long as the reservoir is configured to accommodate a flat-bottomed aperture system and to hold a volume of liquid resin sufficient for forming at least one cured resin layer.

Figure 2:
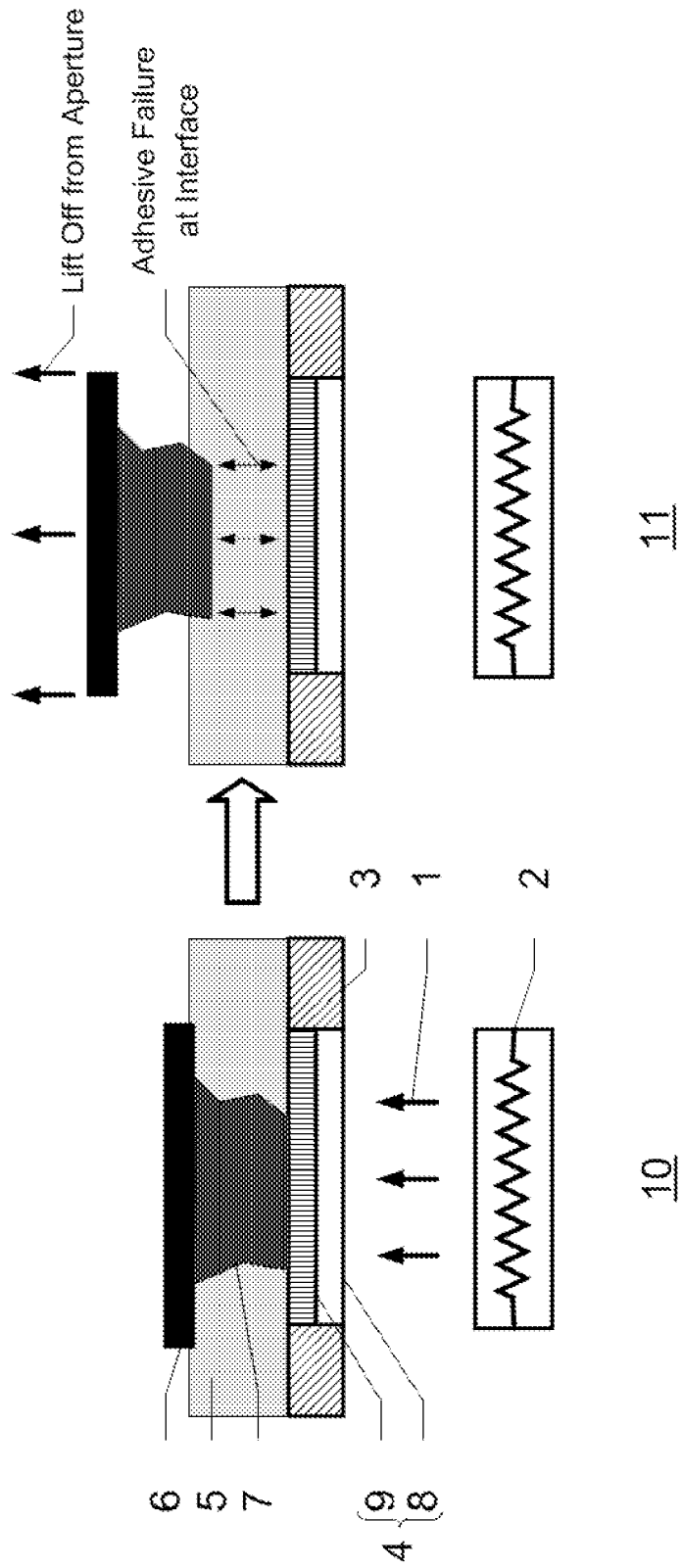
FIG. 2 is a schematic cross-sectional view of a bottom-up stereolithography apparatus, in which a compliant release layer is positioned on the transparent window in order to facilitate separation of the cured photopolymer resin (part) from the aperture.

FIG. 2 shows a schematic cross-sectional diagram of a part being produced in a typical bottom-up stereolithography system and process. As similarly described in FIG. 1, an ultraviolet (UV) light output 1 is produced by an exposure source 2 located below an opaque reservoir 3. The light output is transmitted through an aperture 4 into a liquid photopolymer resin 5. A mobile (e.g., movable) build platform 6 is provided as a surface or anchor for deposition of a cured photopolymer part 7. In the embodiments described by FIG. 2, the aperture 4 includes a window 8 and a compliant release layer 9 on the window 8 (e.g., between the window and the liquid photopolymer resin, and/or the window and the cured photopolymer part). The window and compliant release layer are described in more detail below.

During each deposition of a cured resin layer, the build platform 6 is submerged in the liquid photopolymer resin so that the lower surface of the build platform and/or the cured photopolymer part 7 attached to the build platform are positioned at a suitable distance from the aperture, the distance including a layer of liquid photopolymer resin with a thickness corresponding to the desired thickness of the next cured resin layer. In block 10, the layer of liquid photopolymer resin positioned between the lower facing surface of the build platform or cured photopolymer part 7 and the upper facing surface of the aperture 4 is exposed to the light output 1 being transmitted through the aperture 4. The layer of liquid photopolymer resin is thereby polymerized onto the bottom of the build platform 6 or cured photopolymer part 7. The resulting cumulative cured photopolymer part 7 is formed between and adjacent to both the build platform 6 and the aperture 4.

In block 11, the build platform moves upward (e.g., away from the aperture) to separate the cured photopolymer part from the aperture (e.g., "lift off from aperture"). The displacement of the build platform enables ingress (e.g., formation) of a new layer of liquid photopolymer resin between the cured photopolymer part and the transparent aperture. The new layer of liquid photopolymer resin may then be cured in the same manner as above.

A low degree of adhesion (e.g., low adhesive strength) between the transparent aperture 4 and the photopolymer resin 5 and/or cured resin part 7 is associated with a high degree of resolution in the photopolymer parts produced by the stereolithography system. For example, a low degree of adhesion facilitates easy removal of the cured photopolymer part 7 after each deposition process, such that the cured photopolymer part is subjected to minimal force and/or strain upon separation from the aperture 4. The degree of adhesion determines or affects the size and/or number of successive layers that can be printed on (e.g., cured adjacent to) the aperture surface. When the cured photopolymer part 7 adheres to the aperture 4, attempts to remove the photopolymer part from the aperture may result in cohesive failure (e.g., breakage or cracking) of the part, at or prior to which point the aperture should be replaced. In some situations, a gradual increase in adhesion between the cured photopolymer part and the aperture as subsequent layers are deposited and removed may limit the usable lifetime of the aperture.

In some embodiments, the aperture 4 may include a window 8. The window may be formed of a material (such as glass, PET, and/or PMMA) that is transparent to UV light and rigid enough to serve as a stable reservoir bottom. However, such materials often have affinity for (e.g., a tendency to adhere to) the cured and/or uncured preceramic photopolymer, and accordingly, windows formed of these materials may readily adhere to the cured photopolymer part once formed. Such adhesion between the cured photopolymer part 7 and the window 8 may interfere with removal of the part, which may crack or experience other structural damage when the part is separated from the aperture.

Accordingly, in some embodiments, the aperture 4 may further include a compliant release layer 9 (as shown in FIG. 2). The compliant release layer 9 promotes adhesive failure at the interface between the cured photopolymer part and the aperture system when a force is applied to separate the part from the aperture system. As used herein, the term "compliant release layer" may be interchangeably used with the terms "compliant membrane", "release film", and "interface layer" to refer to a layer having the function of reducing adhesion at the interface between the cured photopolymer resin and the transparent aperture system. Here, the adjective "compliant" is used to describe the material properties of the layer (e.g., that the layer is flexible), while the term "release" refers to the ability of the layer to encourage release of the cured photopolymer resin from the interface with the aperture system. The compliant release layer may be formed of a UV-transparent material. Typical compliant release layers 9 in the related art include UV-transparent polymers such as silicones or fluorinated polymers, for example, PDMS and PTFE.

Commercially available examples of bottom-up stereolithography systems that incorporate a consumable UV-transparent compliant release layer include the FormLabs Form 1, Form 1+, and Form 2; Carbon M1, Autodesk Ember, B9 Creator, Sprint Ray Moon Ray, and Kudo3D Titan lithography systems. In these systems, "consumable" refers to the fact that the compliant release layer should be periodically replaced as the compliant release layer degrades or is damaged during use. In some systems, for example, the Kudo3D Titan, the compliant release layer is included as a stack of disposable release films. The top-most release film that is in contact with the cured photopolymer resin part is removed and disposed of after completion of each part, thus preventing or reducing the need for replacement of the entire aperture system.

The compliant release layers in these commercially available systems typically include silicones or fluorinated polymers, which are largely compatible with common organic photopolymer resins (e.g., acrylates, methacrylates, urethanes, epoxies, etc.) because the adhesive strength at the interface between the compliant release layer and these polymerized resins is about an order of magnitude lower than the interlaminar (internal layer) strength of the cured photopolymer resin part. However, compliant release layers including silicones or fluorinated polymers are often not suitable for use with high inorganic content photopolymer resins (for example, those containing silicon), because the shared silicon content tends to promote adhesion between the compliant release layer and the cured photopolymer part. Silicon-containing photopolymer resins are of particular interest for their ability to produce pre-ceramic polymer parts that may be pyrolyzed to produce a silicon-containing ceramic material. Such pre-ceramic polymer parts are highly fragile and prone to cohesive or internal breakage when adhered to a compliant release layer including silicones or fluorinated polymers. As such, the use of high inorganic content photopolymer resins and other resin compositions that produce fragile parts in stereolithography has been limited.

Aspects of embodiments of the present disclosure provide an aperture system for a bottom-up stereolithography device. The aperture system may be suitable for use with high inorganic content photopolymer resins and other fragile resins.

In some embodiments, the aperture system may include a reservoir having a lower opening, a flexible membrane positioned within the reservoir and covering the lower opening; and a boundary seal positioned around a periphery of the flexible membrane, the boundary seal including one or more boundary seal components and immobilizing the periphery of the flexible membrane against the reservoir wall. As used herein, the term "flexible membrane" refers to a part having a function different from that of the "compliant release layer" described above.

In some embodiments, the aperture system may further include a transparent window under the flexible membrane and in the lower opening of the reservoir, the transparent window covering the lower opening. The aperture system may further include a compliant release layer between the transparent window and the flexible membrane in the lower opening of the reservoir, the compliant release layer covering the lower opening and having a low affinity for the flexible membrane.

The reservoir may be formed of a durable material that does not transmit light (e.g., is not transparent) and is unlikely to react with the photopolymer resin or any solvent mixed with the photopolymer resin, such as a polycarbonate plastic, a metal, glass coated with an opaque coating, etc. The reservoir may have any suitable shape, volume, floor area, wall height, etc., as long as the reservoir is configured to accommodate a flat-bottomed aperture system and to hold a volume of liquid resin sufficient for forming at least one cured resin layer. The reservoir has an opening in its bottom floor or wall that is configured to accommodate the aperture. The aperture may span or substantially span the opening such that there are no gaps in the bottom of the reservoir through which the liquid photopolymer resin may leak. In some embodiments, the aperture or portions of the aperture may be embedded in the opening. The size and shape of the opening and aperture are not particularly limited, and may be similar to those presently used in commercial systems of the related art, or may be selected by one of ordinary skill in the art according to the desired maximum size (horizontal planar area or footprint) of the manufactured parts, stability of the reservoir, etc.

The flexible membrane may be configured to have any combination of layout, attachment design, material characteristics, etc., that allows the flexible membrane to be attached to the reservoir via the boundary seal and to flex or be deformed during use, as described in example embodiments herein. For example, the flexible membrane may be at least the same shape and size as the opening, and in some embodiments may have a size larger than the opening so that the flexible membrane partially overlaps with the walls of the reservoir around the opening.

In addition, the flexible membrane may be transparent to one or more wavelengths corresponding to the radiation wavelength(s) produced by a bottom-mounted exposure source and/or the wavelength(s) required to initiate polymerization of a liquid photopolymer resin held within the reservoir. For example, when the bottom-mounted exposure source produces UV radiation, the flexible membrane may be transparent to UV radiation between about 200 nm to about 460 nm, or at least one discrete wavelength between about 200 nm to about 460 nm having a suitable energy for polymerizing the resin.

The flexible membrane included in the aperture may be selected or configured to exhibit a low affinity for the photopolymer resin in its cured and uncured forms so that the part can be easily separated from the flexible membrane and is not prone to formation of a high surface area adhesive interface with the flexible membrane during polymerization. The flexible membrane may also be configured to exhibit a low affinity for any aperture components positioned below the flexible membrane so that the flexible membrane can be easily pulled apart (separated) from those components during removal of the cured photopolymer part from the flexible membrane. As used herein, the term "low affinity" refers to a degree of interlayer or intermolecular attraction, interlayer bonding, or interlayer adhesion that does not interfere with the functioning of the aperture over 100 or more photopolymerization cycles, for example, 500 or more photopolymerization cycles or 1,000 or more photopolymerization cycles.

Figure 3:
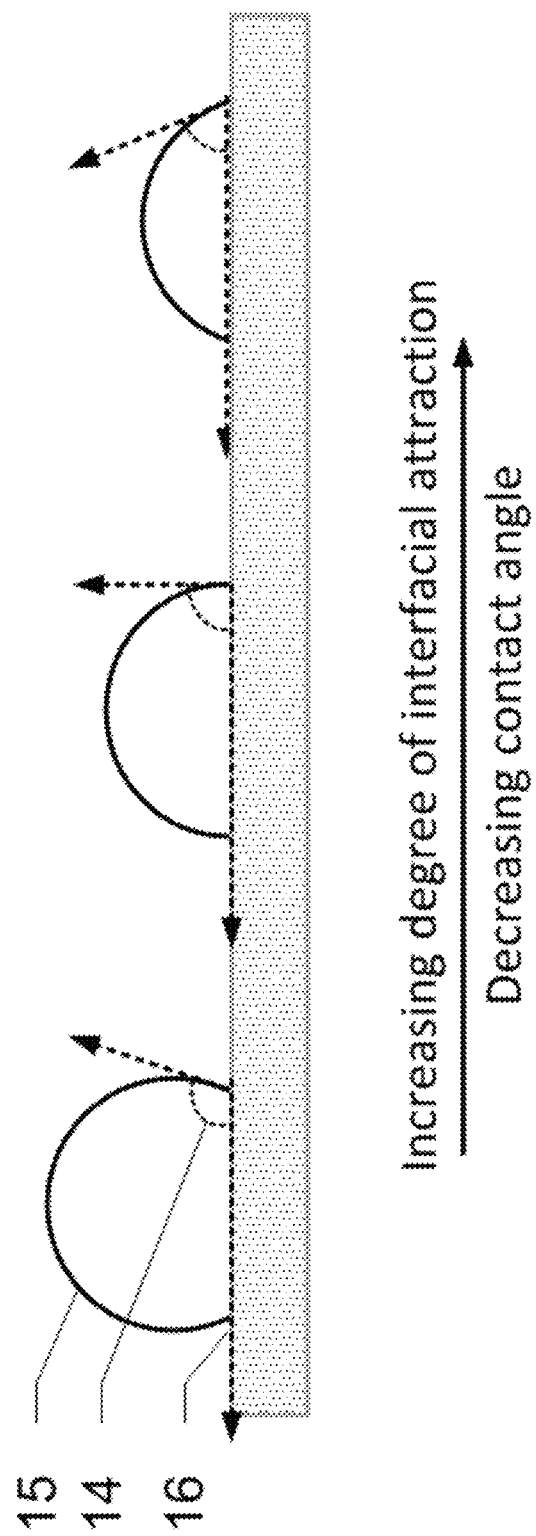
FIG. 3 is a schematic diagram illustrating the contact angle measured for droplets with varying degrees of attraction to a surface.

The affinity between the flexible membrane and the liquid (uncured) photopolymer resin may be described in terms of a contact angle. As used herein, the term "contact angle" is used in its art-recognized sense to refer to the angle between the floor and wall of a droplet of a test liquid on a test surface (e.g., the angle between a first vector parallel to the liquid-solid interface and a second vector normal to the outer surface of the droplet at and perpendicular to the perimeter of the liquid-solid interface) as a proxy for the amount of intermolecular attraction between the liquid and solid substances. FIG. 3 is a schematic diagram illustrating contact angles 14 measured for droplets 15 with varying degrees of attraction to a surface 16. In some embodiments, for example, the flexible membrane may be configured to have a contact angle with the liquid photopolymer resin of greater than about 40°, for example, about 40° to about 90°, about 40° to about 60°, or about 60° to about 90°. For example, the flexible membrane may be formed of a specific material having a contact angle within the above range, or the flexible membrane may be further surface treated, texturized, etc. to further modify the contact angle to be within the above range with respect to the liquid photopolymer resin being used. The contact angle between the liquid resin and the flexible membrane may depend on several factors, such as the composition of the resin, surface functional groups of the flexible membrane, and microscale structure of the membrane, and it will be understood that those of ordinary skill in the art are capable of selecting suitable structures and compositions for the flexible membrane and liquid resin part in order to attain an appropriate or desired contact angle. The contact angle may be measured and quantified using any suitable method available in the art, such as a static or dynamic sessile drop method, a pendant drop method, or a variation of the Wilhelmy method.

The affinity between the flexible membrane and the solid (cured) photopolymer resin part may be described in terms of an interlayer peel strength. As used herein, the term "interlayer peel strength" may refer to the average amount of force necessary to separate two layers having a commonly shared interfacial surface area. In some embodiments, for example, the flexible membrane may be configured to have an interlayer peel strength with the cured photopolymer resin part of less than about 200 N/m, for example, less than 150 N/m or less than about 100 N/m. For example, the flexible membrane may be formed of a specific material having an interlayer peel strength within the above range, or the flexible membrane may be further surface treated, texturized, etc. to further modify the interlayer peel strength to be within the above range with respect to the photopolymer resin part being formed. The peel strength between the flexible membrane and cured resin part may depend on several factors including the interfacial surface area, and it will be understood that those of ordinary skill in the art are capable of selecting suitable structures and materials for the flexible membrane and cured resin part in order to attain an appropriate or desired peel strength.

The flexible membrane may be formed of a material having a suitable elasticity and affinity for the cured photopolymer resin, as described above. In some embodiments, for example, the flexible membrane may be formed of an aliphatic polymer. Non-limiting examples of aliphatic polymers include polystyrene (PS), polymethylpentene (PMP), cyclic olefin copolymers (COC), fluorinated ethylene propylene (FEP), perfluoroalkoxyalkane (PFA), polytetrafluoroethylene (PTFE), and mixtures thereof.

The thickness of the flexible membrane may be selected according to one or more considerations, including the desired total thickness of the aperture, the durability, stiffness, and refractive index of the flexible membrane, and the presence or absence of additional aperture components. In some embodiments, the flexible membrane may have a thickness of about 10 µm to about 750 µm. For example, the flexible membrane may have a thickness of about 50 µm to about 500 µm, or about 200 µm to about 400 µm. However, embodiments of the present disclosure are not limited thereto, and those of ordinary skill in the art are capable of selecting suitable membrane thicknesses according to the desired configuration of the device and the principles described herein.

When the flexible membrane has a thickness that is relatively small (thin) in comparison to the thicknesses of the transparent window and/or the compliant release layer, the durometer, refractive index, and transparency of the flexible membrane may have a correspondingly small effect on the overall absorbance and scattering of the aperture as a whole. Accordingly, in some embodiments, the flexible membrane may include materials typically considered ill-suited or unsuitable for the window and/or compliant release layer (e.g., due to its durometer, refractive index, and transparency). However, embodiments of the present disclosure are not limited thereto, and a person of ordinary skill in the art is capable of selecting a suitable flexible membrane and/or materials included therein based on the principles described herein.

The boundary seal is positioned around the periphery of the flexible membrane on the side of the reservoir-membrane interface that is in contact with the photopolymer resin (e.g., within the reservoir). The boundary seal may perform two functions. First, the boundary seal may block or prevent ingress of the liquid photopolymer resin below the flexible membrane, thus reducing resin loss as well as the chances of resin curing and deposition within the aperture system, for example, when multiple component layers are included in the aperture. In sealing the aperture system against photopolymer resin ingress, the boundary seal may thus increase or improve the lifetime of the device by reducing the chances that cured photopolymer resin (which may be UV-opaque) will adhere to the aperture components and render the system inoperable by blocking light transmission. Second, the boundary seal may apply a suitable amount of tension to the flexible membrane in order to constrain its displacement and maintain the position of the flexible membrane in relation to other parts of the aperture system, even after the flexible membrane is placed in a deformed state (e.g., pulled out of a planar conformation). For example, if the membrane tension is too high, the membrane may not flex sufficiently and/or may tear as the cured part is lifted off of the aperture. However, if the membrane tension is too low, release of the part from the membrane may be followed by sagging or wrinkling of the flexible membrane, which could lead to subsequent distortion and scattering of the light traveling through the aperture from the exposure source into the resin. It will be understood that those of skill in the art are capable of selecting an appropriate membrane tension according to the principles described herein.

The boundary seal may be formed of combined multiple components or may be formed as a single component. The boundary seal and its components may be permanent (e.g. an integral part of the aperture system), or may be removable (e.g., non-permanent), with the choice being dependent upon the desired properties of the aperture system. For example, a permanent boundary seal may be less likely to leak, whereas a removable boundary seal may allow access to and replacement of the aperture system parts (including the transparent window, compliant release layer, and/or flexible membrane). In some embodiments, the boundary seal may include a combination of permanent and removable elements.

When the boundary seal is permanent, non-limiting examples of components that may be included in the boundary seal include chemical seals such as adhesives (such as epoxies, acrylates, etc.) and sealants (such as silicones, urethanes, etc.), and non-reversible mechanical attachments (such as interference fits, pawls, etc.). When the boundary seal includes a permanent chemical seal such as an adhesive or sealant, the adhesive or sealant may be selected for its compatibility (e.g., lack of reactivity) with the liquid photopolymer resin. In some embodiments, the boundary seal may include acrylated urethanes, silicones, and/or cycloaliphatic epoxies.

When the boundary seal is removable, non-limiting examples of components that may be included in the boundary seal may include mechanical fasteners, magnets, tape, and reversible snap fits. In some embodiments, when the boundary seal includes a mechanical fastener, the mechanical fastener may include a screw, a bolt, a crimp, a clamp, a clip, etc.

In some embodiments, the boundary seal may include magnets or be held in place using a magnetic force. This magnetic attachment method may be particularly suitable when the boundary seal is immersed in photopolymer resin, because the non-interlocking magnetic seal is less prone to becoming jammed with fully or partially cured resin. In some embodiments, the boundary seal may include multiple paired magnets. In some embodiments, the boundary seal include a series of permanent magnets paired with (attracted) to a rail, structure, series of pieces, etc. comprising a ferromagnetic material. However, embodiments are not limited thereto, and a person of ordinary skill in the art should be capable of selecting other suitable magnetic attachments according to the principles described herein.

When the boundary seal is held in place with a magnetic force, the magnets may have any holding power suitable to maintain tension on the membrane and/or to enforce the boundary seal when the cured photopolymer part is removed from the aperture system. In some embodiments, for example, the magnets may have a holding power of about 0.5 lb. to about 1 lb. each, for a total holding power (magnetic attachment force) of at least 5 lbs., and in some embodiments about 5 lbs. to about 60 lbs.

In some embodiments, the removable boundary seal may be achieved by a pressure differential such as that applied by utilizing a vacuum chuck. The vacuum applied by the vacuum chuck may be any suitable level of vacuum that maintains a seal when the cured photopolymer part is separated from the flexible membrane, for example, about 10-30 inches Hg, or about 10-20 inches Hg.

In some embodiments, the boundary seal may be flush or substantially flush with the surface of the aperture within the resin reservoir. For example, when the boundary seal is achieved by a pressure differential instead of a component having a physical height, the surface of the aperture system may be substantially flat. Similarly, when the boundary seal is achieved by a permanent sealant, the profile of the sealant may be low or substantially flat. In some embodiments, the boundary seal may extend to a height greater than that of the aperture system within the reservoir. When the boundary element extends above the surface of aperture system, the boundary seal may incorporate resin exchange features such as vents, channels, baffles, or troughs in order to facilitate fluid exchange or flow between the volume of resin within the aperture system boundary and the volume of resin outside of the aperture system boundary. Schematic descriptions of embodiments including various kinds of boundary seals are provided in the Examples.

In some embodiments, the aperture may further include a transparent window under the flexible membrane and in the lower opening of the reservoir. The transparent window is transparent to one or more wavelengths required to initiate polymerization of the liquid photopolymer resin, as described herein in connection with the flexible membrane. The transparent window may be formed of a material having a suitable strength and rigidity to serve as the bottom of the photopolymer reservoir. For example, when the bottom-mounted exposure source produces UV radiation, the window may be transparent to UV radiation between about 200 nm to about 460 nm, or at least one discrete wavelength between about 200 nm to about 460 nm. In some embodiments, for example, the transparent window may be formed of a glass (e.g., quartz, fused silica, sapphire), polyethylene terephthalate (PET), biaxially-oriented polyethylene terephthalate (BOPET), polymethylpentene (PMP), cyclic olefin copolymers (COC), polycarbonate, polymethylmethacrylate (PMMA), and mixtures thereof.

In some embodiments, the composition and thickness of the window may be selected so that the refractive index of the window is matched to that of the material occupying the volume between the window and the exposure source (e.g. air) as well as that of other materials included in the aperture. When index matching is difficult or not feasible, the refractive index difference may be minimized by reducing the thickness of the window. In some embodiments, the window may have a thickness of about 1 mm to about 16 mm. For example, the window may have a thickness of about 1 mm to about 10 mm, or about 1 mm to about 5 mm.

When the aperture system includes a compliant release layer, the compliant release layer may be between the flexible membrane and the transparent window. The compliant release layer allows the cured photopolymer part to be pressed into intimate contact against the aperture system without being damaged. Accordingly, the compliant release layer may be selected to have some compliance (e.g., have a low hardness or durometer) to prevent or reduce damage to the cured photopolymer part as it is removed from the aperture. If the durometer is too high, the interface will not deform (e.g., yield) when the part separates from the aperture system, and part damage may be induced by this process. In some embodiments, the material used to form the compliant release layer may have a durometer of about 30 OO to about 65 A. The composition, transparency, and refractive index of the material used to form the compliant release layer may be selected to reduce or minimize light absorption and scattering in a manner similar to the transparent window.

Non-limiting examples of materials that satisfy the needs of this compliant release layer may include silicones and urethanes having durometers ranging from extra soft to medium hard. In some embodiments, for example, the compliant release layer may be formed of a silicone elastomer such as Sylgard® 184 or Lumisil® 7600. Since the flexible membrane separates the photopolymer resin from the compliant release layer, the compliant release layer may include materials which are incompatible with the liquid or solid (cured) preceramic photopolymers. As used herein, the term "incompatible" refers to a material or composition capable of reacting with and/or adhering to the liquid or cured preceramic photopolymers.

In some embodiments, the compliant release layer may have a thickness of about 0.1 mm to about 13 mm, for example, about 1 mm to about 10 mm, and in some embodiments, about 3 mm to about 6 mm. The horizontal planar area of the compliant release layer may be any suitable size to cover or protect the transparent window, for example, about the same size or larger than the transparent window.

While specific combinations of the above components may be described in present disclosure, it will be understood that embodiments of the present disclosure are not limited thereto. Additional combinations of the above components, including those configurations in which two or more components are integrated as a single component, are included within the scope of embodiments of the present disclosure. Furthermore, unless otherwise stated, aperture systems including one or more of the above components are not limited to those components, and may be further combined with elements and devices not explicitly described herein.

Figure 4:
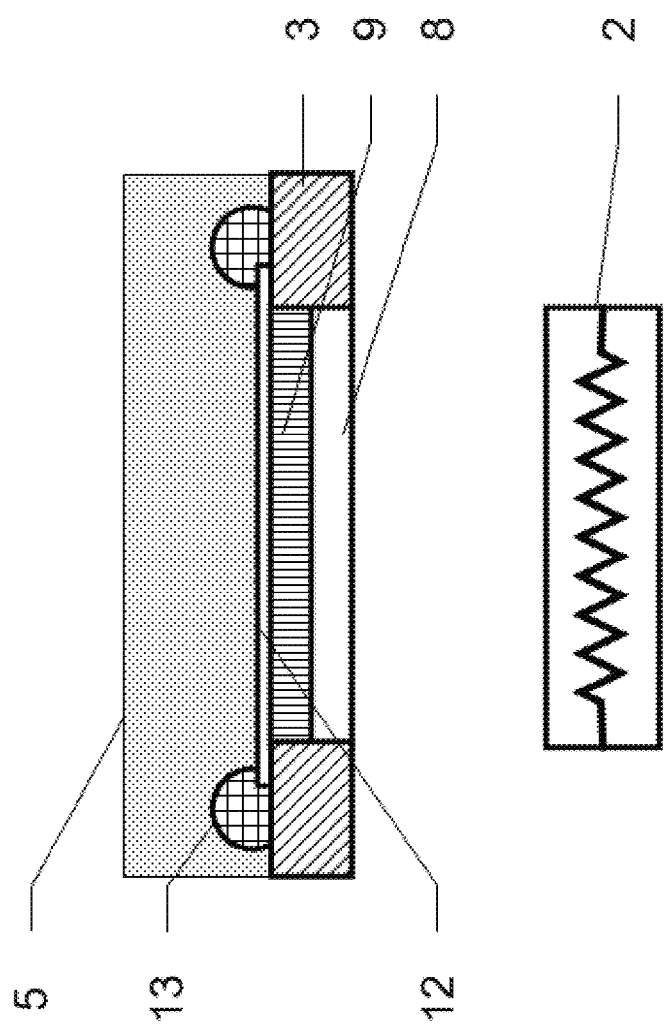
FIG. 4 is a cross-sectional view of an example aperture system including a reservoir, a boundary seal, a flexible membrane, a compliant release layer, and a transparent window, according to embodiments of the present disclosure.

In some embodiments, the aperture may include a flexible membrane, a compliant release layer, and a transparent window. FIG. 4 is a simplified schematic cross-sectional diagram of an aperture system including a reservoir 3, a flexible membrane 12, a boundary seal 13, a transparent window 8, and a compliant release layer 9, according to embodiments of the present disclosure. The reservoir 3 holds a volume of liquid photopolymer resin 5 above an exposure source 2. The flexible membrane 12 is positioned between the liquid photopolymer resin 5 and the compliant release layer 9, while the compliant release layer 9 is positioned on the transparent window 8. The flexible membrane 12 is held in place around its periphery by the adhesive boundary seal 13, which blocks or prevents ingress of the photopolymer resin 5 between the flexible membrane 12 and the compliant release layer 9.

In some embodiments, the aperture may omit one or both of the compliant release layer 9 or the transparent window 8, such that the flexible membrane 12 is suspended under tension. For example, the flexible membrane 12 may be combined with a transparent window 8 without (e.g., in the absence of) the compliant release layer 9, such that a gap is formed between the flexible membrane 12 and the window 8. Alternatively, the flexible membrane 12 may be suspended directly above an exposure source (e.g., without a transparent window or compliant release layer supporting the bottom surface of the flexible membrane). In either design, the tension on the flexible membrane 12 is configured to be sufficiently high enough to prevent or reduce wrinkling or buckling. Furthermore, the thickness and tension of the flexible membrane may be selected such that it is not significantly deformed by the weight of the photopolymer resin on the unsupported flexible membrane layer, but still maintains flexibility during peeling.

Figure 5:
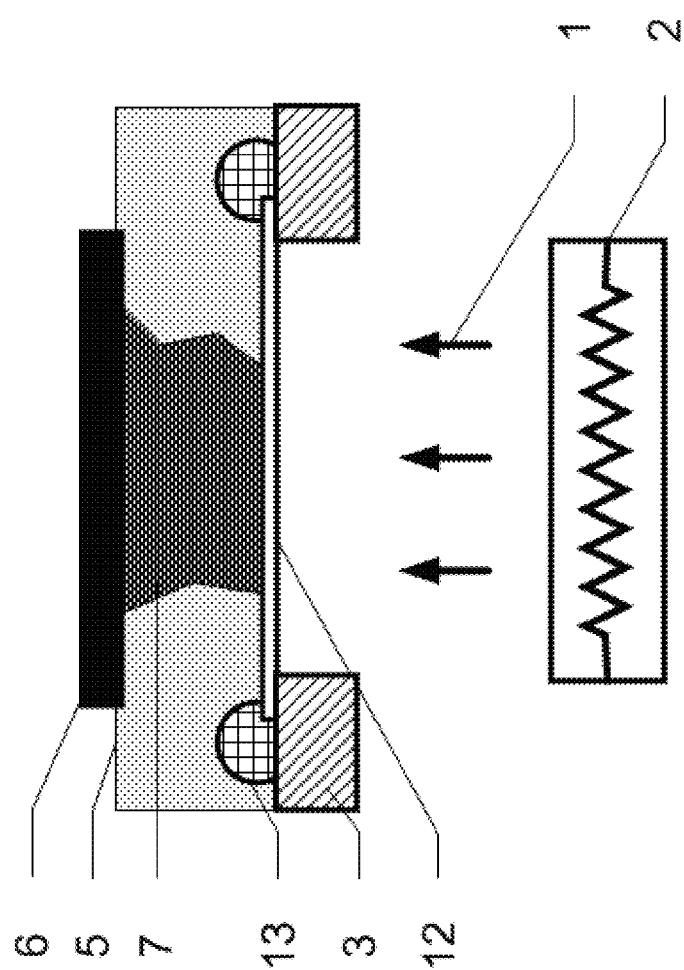
FIG. 5 is a schematic cross-sectional view of an example aperture system including only a reservoir, a boundary seal, and a flexible membrane, according to embodiments of the present disclosure.

FIG. 5 is a schematic cross-sectional view of an example aperture system including only a reservoir 3, a boundary seal 13, and a flexible membrane 12, according to embodiments of the present disclosure. Here, the aperture is simplified so that only the flexible membrane 12 directly contacting the photopolymer resin 5 and 7 is present.

Conventional bottom-up stereolithography systems in the related art typically include an aperture including a transparent window and a compliant release layer, such that the photopolymer resin is in contact with the compliant release layer. In these systems, the compliant release layer is configured to perform two functions. First, the compliant release layer is configured to prevent or reduce adhesion between the cured photopolymer part and the transparent aperture. Second, the compliant release layer is configured to allow the cured photopolymer part to be pressed into intimate contact against the aperture without being damaged. Both functions are directly or indirectly dependent on the composition of the compliant release layer, as described herein. As such, the composition of the compliant release layer is limited to materials that are suitable for both functions.

The combination of a flexible membrane and a compliant release layer, with the flexible membrane being on or above the compliant release layer, may enable decoupling of these two functions. As a result, two different materials may be used for each component and function. In some embodiments, for example, the flexible membrane may serve as the surface that contacts the resin and reduces adhesion between the part and aperture, while the compliant release layer may serve as a foundation that enables the part to be pressed against the aperture, but is not exposed to the resin. As such, the flexible membrane may be formed of a hard (e.g., high durometer) and non-adhesive material, while the compliant release layer may be formed of low durometer material having high adhesion potential with the cured photopolymer part. As such, the flexible membrane and compliant release layer may each be selected from a wider range of materials, and may be separately optimized for their respective functions.

Because the flexible membrane can stretch and deform towards the cured photopolymer part and/or build platform (e.g., in the direction of movement) as the cured part is lifted off (e.g., moved away from the aperture), an aperture including a flexible membrane exhibits different separation behavior from an aperture in which parts are deposited directly on a compliant release layer. As the flexible membrane deforms from a planar shape to a bell curve shape, the adhesive failure mode at the interface between the cured photopolymer part and the flexible membrane changes from being purely Mode I (peel) to being mixed mode (e.g., Mode I (peel)+Mode II (shear)). The modified (mixed) adhesive failure mode requires less energy to separate the cured photopolymer part from the aperture. As such, the cured photopolymer part can be removed using a reduced amount of force compared to the amount of force required for separation according to any pure mode (e.g., purely Mode I, purely Mode II, etc.). This mixed mode interface separation may enable thick (>75 mm thickness) or fine-featured (<50 µm resolution) preceramic polymer components to be fabricated without damage induced by excessive strain placed on the cured resin during attempts at separation. The combination of reduced adhesion potential between the two surfaces (e.g., the cured photopolymer part and the flexible membrane) and a lower energy adhesive failure mode may enable more efficient and reproducible production of preceramic polymer components in bottom-up stereolithography devices.

Figure 6:
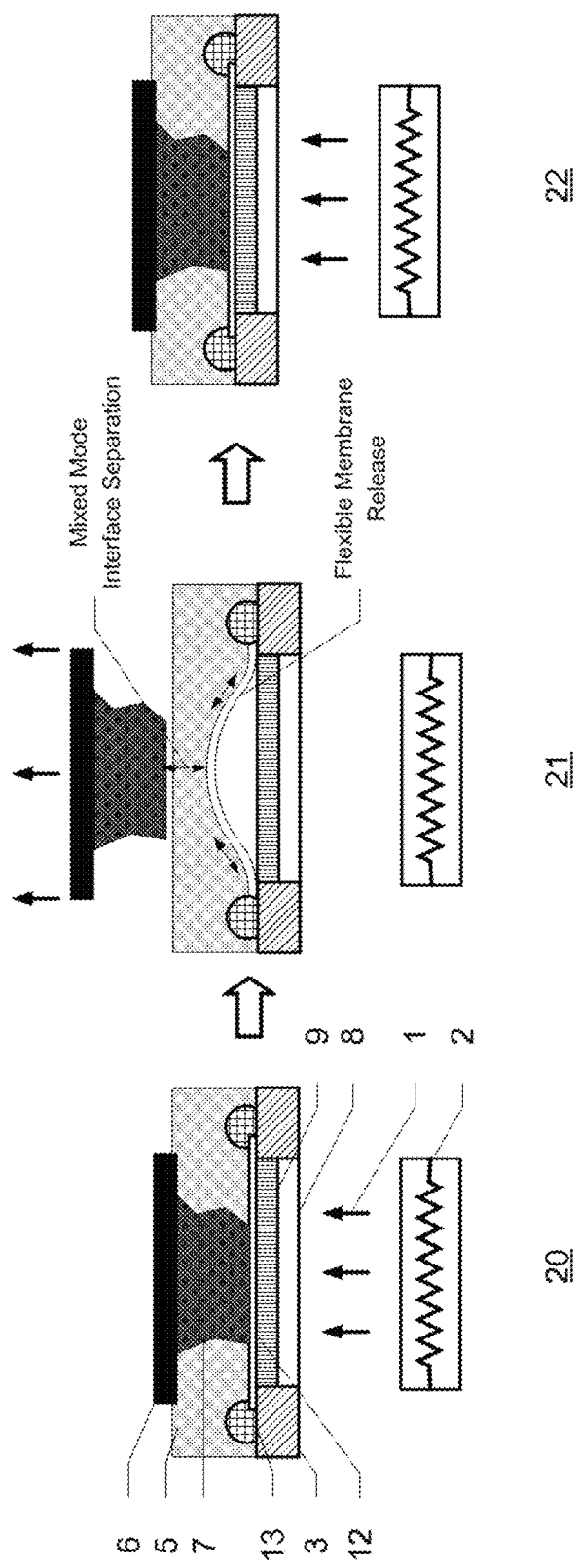
FIG. 6 is a schematic cross-sectional view illustrating the mixed mode separation and release that occurs when the cured photopolymer resin is removed from interfacial contact with the flexible membrane, according to embodiments of the present disclosure.

FIG. 6 is a cross-sectional schematic diagram illustrating the mixed mode interface separation enabled by inclusion of the flexible membrane in the example aperture system of FIG. 4. In block 20, the photopolymer resin 5 is exposed to UV light output 1 so that a layer of the cured photopolymer resin part 7 is formed (e.g., cured/deposited) adjacent to the flexible membrane 12. In block 21, the build platform 6 moves away from the flexible membrane 12 and aperture system, pulling the cured photopolymer resin part 7 and the attached portion of the flexible membrane 12 away from the compliant release layer 9 positioned below it. As the cured photopolymer resin part 7 pulls on the flexible membrane 12, the shape of the membrane is distorted from a planar surface to that of a concave down parabolic function or bell curve, with the peak of the curve corresponding to the center of the attached portion and the zeroes of the curve corresponding to the edges of the flexible membrane. Upon deformation of the flexible membrane 12, the adhesive failure mechanism at the interface between the flexible membrane 12 and the cured photopolymer resin part 7 shifts from pure Mode I (peel) to a lower energy mixed mode ("Mixed mode interface separation") so that separation of the flexible membrane 12 and the cured photopolymer resin part 7 occurs ("Flexible membrane release"). In block 22, the build platform is then positioned a suitable distance away from the flexible membrane corresponding to the desired thickness of the next deposited layer. The photopolymer resin is again exposed to UV light output 1 in block 20 so that the next layer is formed adjacent to the flexible membrane.

Figure 7A:
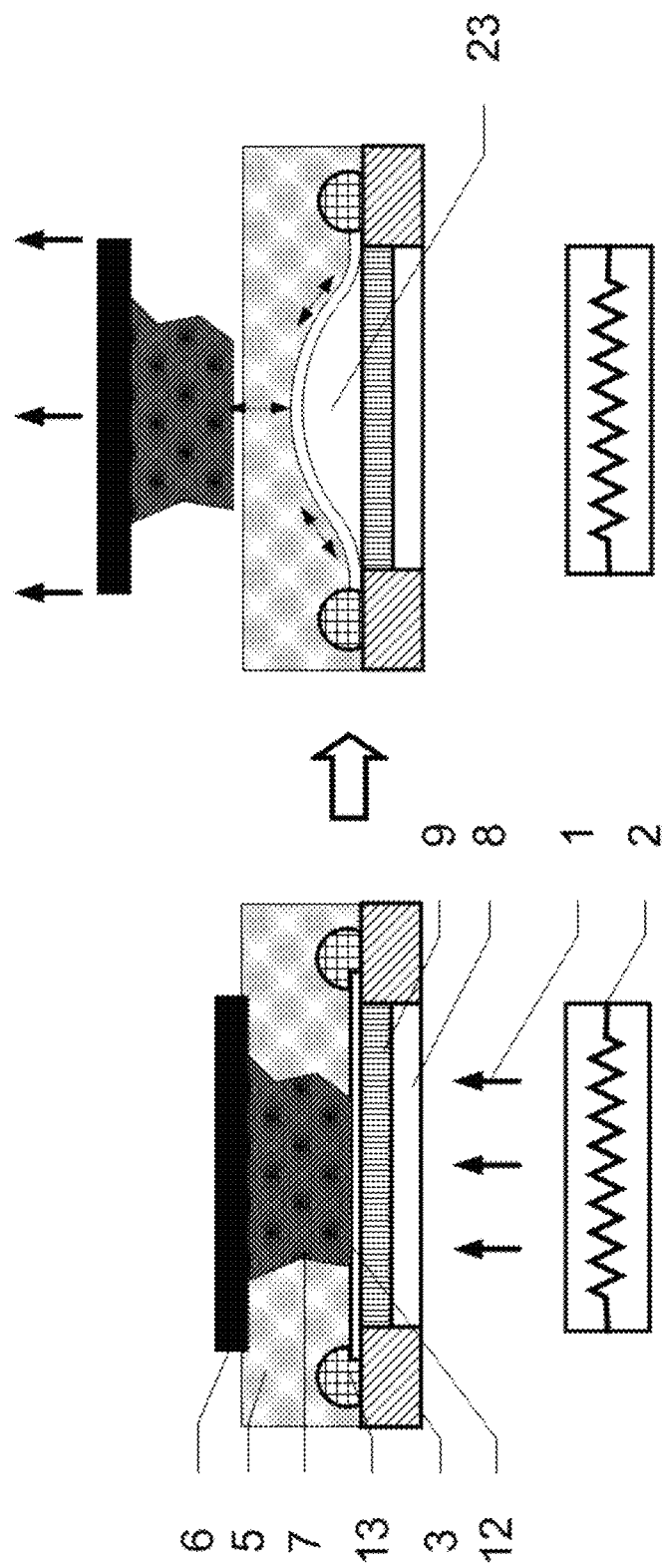
FIG. 7A and FIG. 7B are schematic cross-sectional views illustrating example aperture systems in which (A) a vacuum or (B) a fluid or liquid is present at the interface between the flexible membrane and the compliant release layer during separation and release of the cured photopolymer resin, according to embodiments of the present disclosure.

In some embodiments of the aperture system, the flexible membrane and the compliant release layer are in intimate (e.g., direct) contact over an area corresponding to the surface area of the photopolymer resin being exposed to the UV exposure source. The flexible membrane is pulled away from the compliant release layer during removal of the cured photopolymer part from the aperture, such that the flexible membrane deforms near its center while remaining fixed at the boundary seal. The resulting displacement between the flexible membrane and the boundary seal leads to creation and/or deformation of an intervening volume. FIG. 7A is a schematic diagram highlighting the creation of a volume 23 between the compliant release layer 9 and the flexible membrane 12 upon deformation of the flexible membrane, which is occupied by a low pressure air gap or vacuum. The low pressure within this volume 23 relative to the photopolymer resin material 5 in the surrounding reservoir exerts a restoring force on the flexible membrane 12, and causes the flexible membrane to "hiccup" or jump back toward a flat geometry upon release of the cured photopolymer resin part 7. This movement may cause damage to the part and/or require additional energy input for release.

Figure 7B:
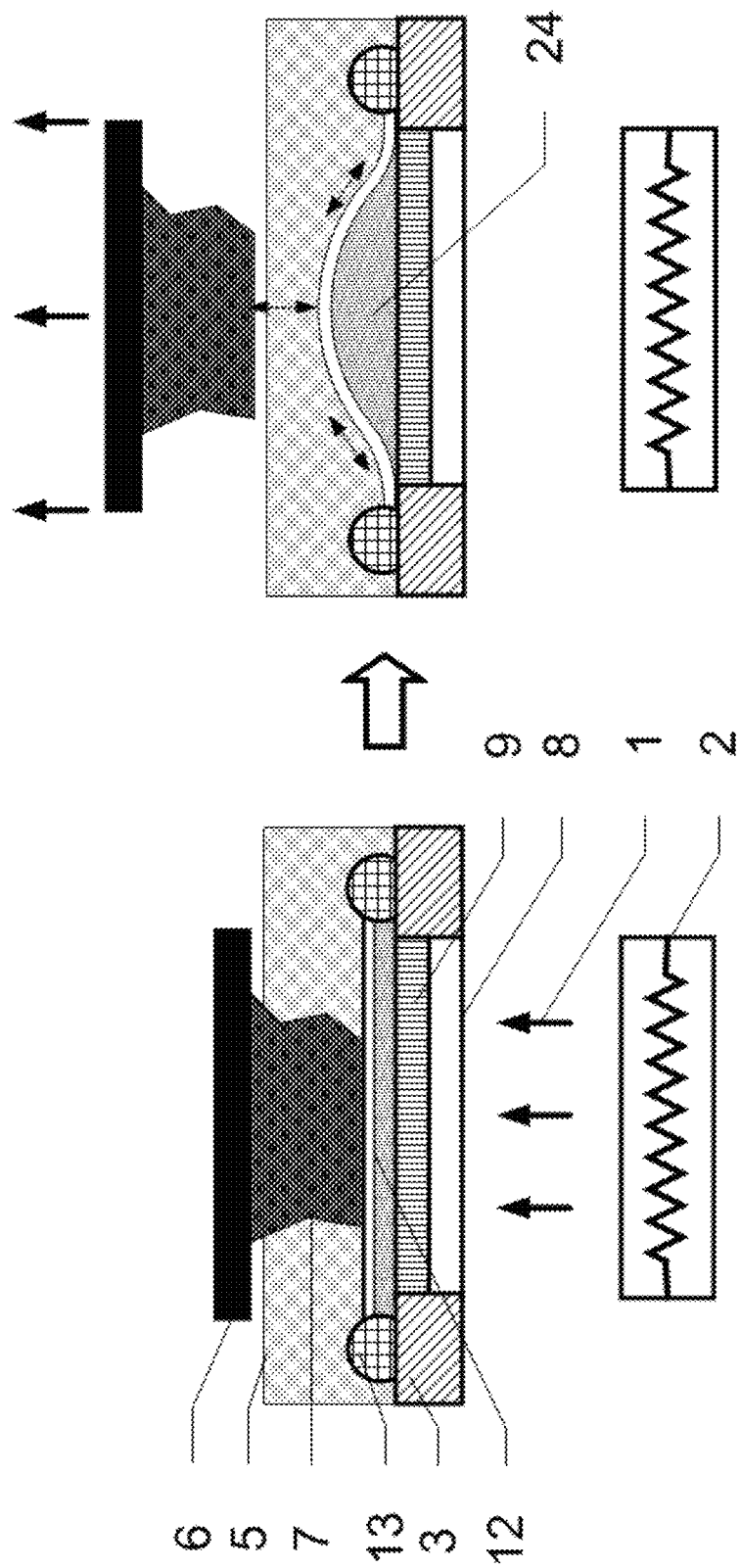

In some embodiments, this pull back force may be attenuated by adding an additional gas or fluid to the interface between the flexible membrane and compliant release layer. Accordingly, in some embodiments, the aperture system may further comprise a gas and/or liquid between the compliant release layer and the flexible membrane. FIG. 7B is a schematic cross-sectional view of an embodiment in which the volume between the flexible membrane 12 and the compliant release layer 9 is occupied by a fluid interface 24, which is deformed upon lifting of the cured photopolymer part 7. The presence of this fluid interface 24 may facilitate mixed mode interface separation by reducing the amount of energy input needed to deform the flexible membrane 12. However, in some embodiments, the presence of the fluid interface 24 may also impede the membrane from returning to a uniformly flat surface, which may negatively affect level disposition of additional layers.

In some embodiments, when the fluid interface 24 includes a gas, the gas may include nitrogen, argon, helium, air, carbon dioxide, or a mixture thereof, etc. In some embodiments, the gas may be included at a pressure of about 1 atm, for example 1 atm to 0.8 atm.

In some embodiments, when the fluid interface 24 includes a liquid, the liquid may include water, an alcohol, an oil, a photopolymer resin without a photoinitiator component, or a mixture thereof. Any suitable gas and/or liquid may be used as long as it does not interfere with or reduce transmittance of the light output into the resin and is suitably index-matched to the other components of the aperture system.

In some embodiments, a fixed amount of the gas and/or liquid may be injected and sealed within the interface prior to use of the aperture system, for example with a hypodermic needle, and may therefore be present in the interface at all times. When the cured resin is pulled away from the flexible membrane, the volume of the gas and/or liquid in the interface may increase and the vapor pressure may decrease. In some embodiments, a portion or all of the gas and/or liquid may be injected or pulled into the interfacial space during membrane deformation, e.g., from a separate coupled reservoir, and returned or pushed back to the separate reservoir when the membrane is allowed to fall back into place. However, the gas or liquid is not an exchange fluid with the photopolymer resin, and is not coupled to the reservoir containing the photopolymer resin.

Figure 8:
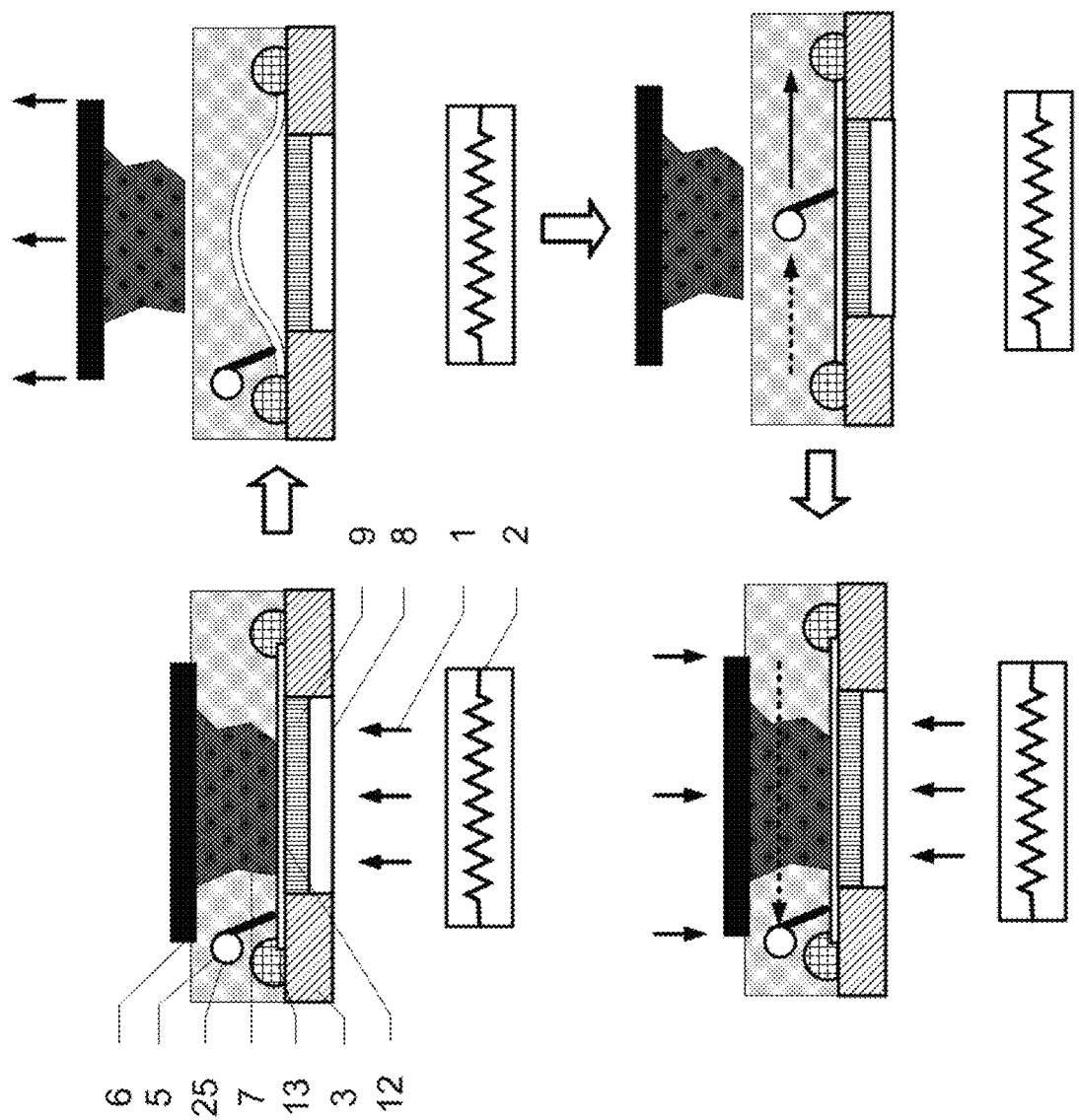
FIG. 8 is a schematic cross-sectional view of an example aperture system in which a sweeper arm is included to facilitate cleaning and repositioning of the flexible membrane following separation and release of the cured photopolymer resin, according to embodiments of the present disclosure.

In some embodiments, the aperture system may further include a sweeper arm. The sweeper arm may be positioned on the top surface of the flexible membrane and may be used to clean and position the membrane surface between successive exposures. FIG. 8 is a schematic diagram of an embodiment including a sweeper arm 25, which traverses the exposure surface of the aperture system to clear any residual resin and/or to remove any wrinkles in the flexible membrane 12. While not required for operation of the aperture system, the sweeper arm may enable the use of thinner flexible membranes, which are more prone to wrinkling, or the wider use of flexible membrane materials with greater adhesive strength to the cured preceramic photopolymer. In addition, the sweeper arm 25 may be suitably used to flatten the flexible membrane 12 in embodiments in which a fluid is included in the flexible membrane/compliant release layer interface, as described above.

In some embodiments, the compliant release layer and transparent window are integrated, and may be included in the aperture system as a single body (e.g., a "compliant window"). As used herein, the term "integrated" may refer to a state in which the physical forms and functions of the previously separate parts (e.g., the compliant release layer and the transparent window) are combined into a single part or body having the combined functions of both. The physical form or footprint of the single body may be similar to or substantially the same as the combined volume or footprint of the previously separate parts; however, embodiments of the present disclosure are not limited thereto.

In some embodiments, the flexible membrane and transparent window are integrated, and may be included in the aperture system as a single body without a compliant release layer therebetween. The physical form or footprint of the single body may be similar to or substantially the same as the combined volume or footprint of the previously separate parts; however, embodiments of the present disclosure are not limited thereto.

In some embodiments, the compliant release layer is removed (e.g., the aperture includes a flexible membrane and transparent windows, but does not include a compliant release layer) and an intervening volume or thickness between the flexible membrane and the transparent window is enlarged and filled with gas or fluid. For example, the compliant release layer may be replaced by a gas or fluid that carries out the same functions of enabling the cured photopolymer part to be pressed against the aperture, and facilitating easy separation of the flexible membrane from the aperture system. The gas or fluid may be the same as described above regarding the gas or fluid interface between the flexible membrane and compliant release layer. When the compliant release layer is replaced by a gas or fluid, the thickness of the intervening volume may be about 0.1 mm to about 13 mm, for example, about 1 mm to about 10 mm; and in some embodiments, about 3 mm to about 7 mm.

Aspects of embodiments of the present disclosure provide a stereolithography device including: a build platform, a reservoir positioned below the build platform so that the build platform can be lowered into or raised out of the reservoir, an aperture positioned within and covering at least a portion of a bottom of the reservoir, and an exposure source positioned below the reservoir and configured to emit light (e.g., patterned light) so that the light passes through the aperture.

The build platform, reservoir, and exposure source are not particularly limited, and may be similar to commercially available elements in terms of suitable materials and sizes.

The light may be any form of light capable of initiating a photopolymerization reaction in any resin that may be used within the stereolithography device, e.g., by generating a reactive species capable of one or more bond-forming reactions. In some embodiments, the light may be ultraviolet (UV) light, e.g., light having a wavelength of about 200 nm to about 460 nm. The light may be generated by any suitable exposure source, such as a digital projector, a lamp, an LED, a laser, etc. The light may be in any suitable form, and for example, may be collimated (coherent) or non-coherent. However, embodiments of the present disclosure are not limited thereto, and a person of skill in the art is capable of selecting an appropriate light and exposure source based on the principles described herein.

The aperture system may be the same as any one of the embodiments described in the present disclosure, or may have any compatible combination of features of the above-described embodiments, as long as the aperture system includes a flexible membrane as described herein.

The stereolithography device may further include a liquid photopolymer resin within the reservoir. The resin may be any UV-curable photopolymer resin. The UV-curable photopolymer resin may include a photoinitiator compound and one or more monomers or oligomers. Upon exposure to UV light energy, the compounds included in the UV-curable polymer precursor mixture may undergo one or more photoinitiated polymerization (photopolymerization) reactions to form a solid material including a polymer network.

The monomers, oligomers, and photoinitiators included in the liquid photopolymer resin are not particularly limited as long as they are compatible with each other (e.g., include mutually reactive functional groups) and are compatible with the exposure source (e.g., are activated at the UV wavelength produced by the exposure source). When the UV-curable photopolymer resin is a pre-ceramic photopolymer resin, the monomers and oligomers may include high amounts of inorganic atoms (such as Si), as described above, and may be substituted with cross-reactive functional groups. However, embodiments of the present disclosure are not limited thereto, and a person of skill in the art should be capable of selecting an appropriate resin mixture or composition according to the principles described herein.

Aspects of embodiments of the present disclosure provide a method of additively manufacturing preceramic parts, the method including: securing a volume of photopolymer resin in a bottom-up stereolithography device equipped with an aperture system, exposing the photopolymer resin to a exposure source positioned below the aperture system to cure a layer of the resin; and pulling the cured layer of resin apart from the aperture system so that the flexible membrane separates from the compliant release layer and the cured layer separates from the flexible membrane. The aperture system may be the same as any one of the embodiments described in the present disclosure, or may have any compatible combination of features of the above-described embodiments, as long as the aperture system includes a flexible membrane as described herein.

In some embodiments, for example, the aperture system may include: a reservoir having a lower opening, a flexible membrane positioned within the reservoir and covering the lower opening; and a boundary seal positioned around a periphery of the flexible membrane, the boundary seal including one or more boundary seal components and immobilizing the periphery of the flexible membrane against the reservoir wall. In some embodiments, the aperture system may further include a transparent window under the flexible membrane and in the lower opening of the reservoir, the transparent window covering the lower opening. The aperture system may further include a compliant release layer between the transparent window and the flexible membrane in the lower opening of the reservoir, the compliant release layer covering the lower opening and having a low affinity for the flexible membrane.

Figure 9:
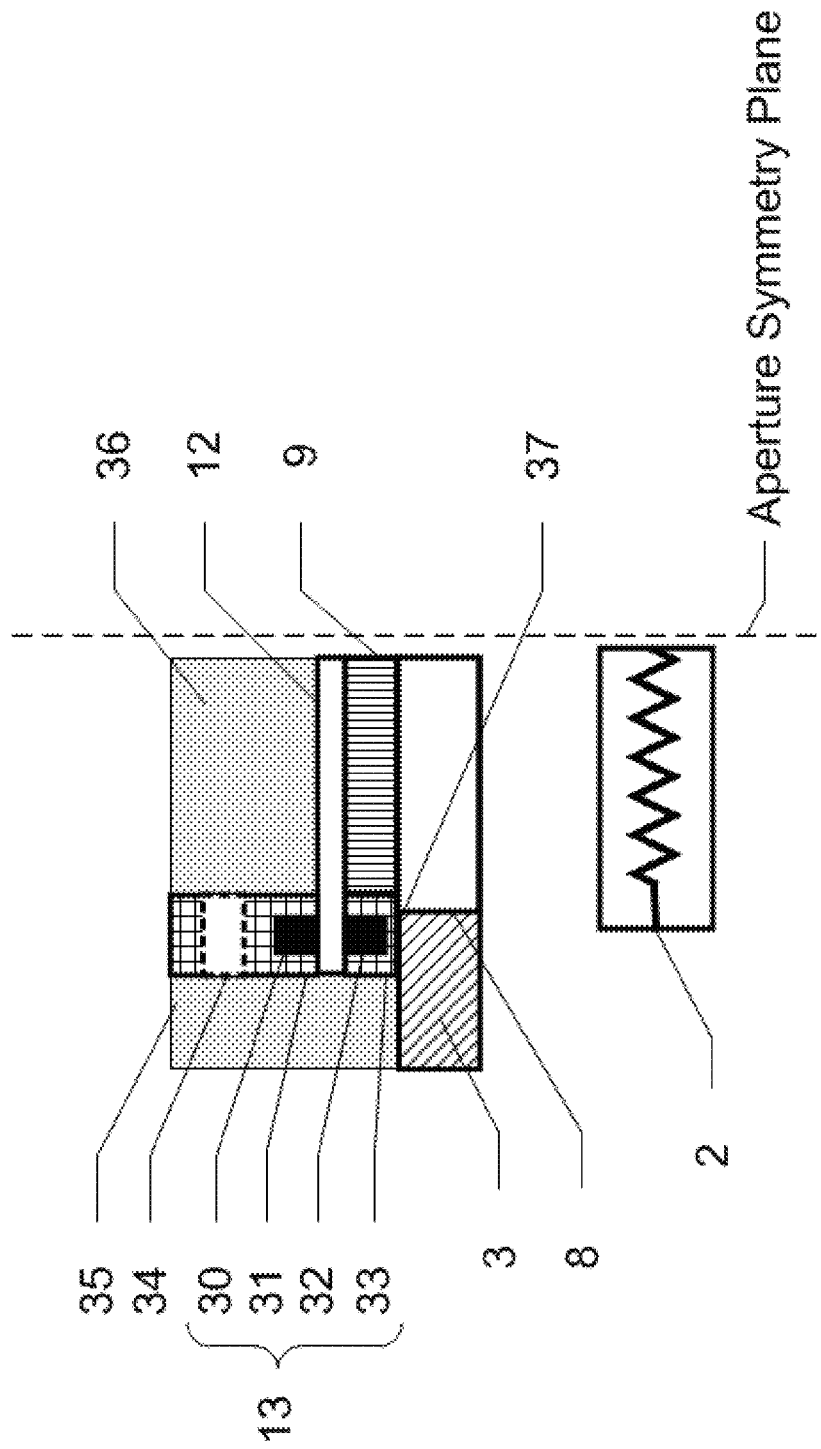
FIG. 9 is a partial schematic cross-sectional view of an example aperture system in which the upper surface of the aperture extends into the liquid photopolymer resin reservoir, and the boundary seal shown in FIG. 3 is replaced by a magnetic clamp with resin exchange features, according to embodiments of the present disclosure.

Additional example embodiments of aperture systems of the present disclosure are shown in FIGS. 9 to 11 for reference. FIG. 9 shows an example embodiment of a aperture system incorporating a transparent window 8, a compliant release layer 9, a flexible membrane 12, and a boundary seal 13. The boundary seal 13 is broken into four separate components for ease of repair/replacement of the membrane and interface elements: a magnetic clamp (N) 30 embedded in an upper boundary seal 31 positioned above the surface of the flexible membrane, and a magnetic clamp (S) 32 embedded in a lower boundary seal 33 positioned below the flexible membrane 12 and on the bottom inner surface of the reservoir 3. Because the boundary seal 13 and aperture surface (i.e., the profile of the flexible membrane 12) extend above the resin reservoir wall, a resin exchange feature 34 (flow channels) are included in the upper boundary seal component 31 to allow for exchange of resin between the outer resin volume 35 and the inner resin volume 36, the two volumes being demarcated by the boundary seal 13. In the embodiment described by FIG. 9, the lower boundary seal 33 is permanently affixed (e.g., using an adhesive bond 37) to the reservoir wall 3, while a non-permanent attractive force between the magnetic clamps 30 and 32 is used to enforce contact of the upper boundary seal 31 against the flexible membrane 12. FIG. 9 illustrates an embodiment in which the two boundary elements 31 and 33 include paired permanent magnets as removable clamps. In some embodiments, mechanical fasteners or integral interlocking features could be used to seal the boundary as well.

FIG. 10 shows an example embodiment in which the surface of the aperture (i.e., the profile of the flexible membrane 12) is flush or nearly level with the lower boundary of the photopolymer reservoir 3. Accordingly, no exchange features are needed to connect and exchange the resin adjacent to the aperture with resin in the rest of the reservoir (collectively shown as photopolymer resin 5). In this design, a small inset in the reservoir 3 is used to mount the transparent window 8 and compliant release layer 9, while the flexible membrane 12 is affixed to the reservoir 3 by a boundary seal 13 including a permanent sealant, such as a chemical bond, silicon based tape, etc., applied around its periphery. This design does not allow for repair or replacement of the flexible membrane element, and the entire aperture system is consumable.

FIG. 11 shows an example embodiment including combined elements of the first and second designs in FIGS. 9 to 10. In the example embodiment of FIG. 11, the compliant release layer and transparent window have been combined into (e.g., replaced by) a single "compliant window" component 40 that is sealed against the reservoir 3 by a boundary seal 13 around its periphery. The flexible membrane 12 is positioned within the reservoir 3 in direct contact with the compliant window 40, and is held in place by a rigid boundary frame mechanically attached to the reservoir 3 via a mechanical attachment 41 (e.g., a screw coupled with a boundary seal). Because the boundary seal 13 does not deeply extend into the reservoir, no resin exchange features are added.

Although embodiments of the present disclosure have been described in relation to silicon-containing preceramic polymers, embodiments of the present disclosure are not limited thereto, and it will be understood that embodiments of the aperture system described herein may be beneficially used in conjunction with other types of polymer and photopolymer resins. For example, embodiments of the present disclosure may facilitate manufacturing of parts with a larger number of layers or delicate features such as bottlenecks that are more susceptible to cohesive failure.

Embodiments of the disclosure described herein may be applied to a variety of additive manufacturing methods and devices in order to reduce part count, scrap, non-recurring engineering, etc. In addition, embodiments of the present disclosure may be applied to additive manufacturing of components and parts used in high wear or high temperature applications that would necessitate ceramic materials, including propulsion structures (vanes, impellors, nacelles, thrusters), control surfaces (fins, leading edges), hypersonic structures (thermal protection systems, heat shields), high wear components (brakes, clutches, rotors), catalyst support structures, pump components, and filters. There is high commercial demand for additively manufactured ceramics in a variety of fields, including: automotive and aerospace, industrial filtration (molten metal filters, flow separators), metal processing (casting molds/blanks), implantable dental and medical devices, and semiconductor processing. Accordingly, embodiments of the present disclosure may be used in bottom-up stereolithography systems to enable additive manufacturing in diverse industries and applications.

As used herein, unless otherwise expressly specified, all numbers such as those expressing values, ranges, amounts or percentages may be read as if prefaced by the word "about," even if the term does not expressly appear. As used herein, the terms "substantially", "about", and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. As used herein, the terms "combination thereof" and "combinations thereof" may refer to a chemical combination (e.g., an alloy or chemical compound), a mixture, or a laminated structure of components.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath", "below", "lower", "under", "above", "upper", and the like, may be used herein for ease of explanation to describe one element or feature's relationship to another element(s) or feature(s) as illustrated in the accompanying drawings. It will be understood that the spatially relative terms are intended to encompass different orientations of the device in use or in operation, in addition to the orientations depicted in the accompanying drawings. For example, if the structures in the accompanying drawings are turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. Plural encompasses singular and vice versa. As used herein, the singular forms "a" and "an" are intended to include the plural forms as well, unless the context clearly indicates otherwise. It will be further understood that the terms "comprises", "comprising", "includes", and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list.

While the subject matter of the present disclosure has been described in connection with certain embodiments, it is to be understood that the subject matter of the present disclosure is not limited to the disclosed embodiments, but, on the contrary, the present disclosure is intended to cover various modifications and equivalent arrangements included within the spirit and scope of the appended claims, and equivalents thereof.

What is claimed is:

1. A reservoir structure for a bottom-up stereolithography device, the reservoir structure comprising:
    a reservoir having a lower opening;
    an aperture system comprising:
        a flexible membrane positioned within the reservoir and covering the lower opening;
        a boundary seal positioned around a periphery of the flexible membrane, the boundary seal comprising one or more boundary seal components and immobilizing the periphery of the flexible membrane against the reservoir; and
        a compliant release layer below the flexible membrane and spanning the lower opening, the compliant release layer being attached to edges of the reservoir structure defining the lower opening or to the boundary seal, and being separable from the flexible membrane,
    wherein the compliant release layer has a durometer of about 30 Shore OO to about 65 Shore A.

2. The reservoir structure of claim 1, the aperture system further comprising:
    a transparent window under the flexible membrane and in the lower opening of the reservoir, the transparent window covering the lower opening.

3. The reservoir structure of claim 1, wherein the flexible membrane is configured to have a contact angle greater than about 40° with a resin used for stereolithography.

4. The reservoir structure of claim 1, wherein the flexible membrane is configured to have an interlayer peel strength of less than about 200 N/m with a cured photopolymer resin part.

5. The reservoir structure of claim 1, wherein the flexible membrane is formed of a material selected from the group consisting of polystyrene (PS), polymethylpentene (PMP), cyclic olefin copolymers (COC), fluorinated ethylene propylene (FEP), perfluoroalkoxyalkane (PFA), polytetrafluoroethylene (PTFE), and mixtures thereof.

6. The reservoir structure of claim 1, wherein the flexible membrane has a thickness of about 10 μm to about 750 μm.

7. The reservoir structure of claim 1, wherein the boundary seal components comprise a reversible mechanical attachment.

8. The reservoir structure of claim 7, wherein the reversible mechanical attachment comprises a magnet having a magnetic force of about 5 lbs. to about 60 lbs.

9. The reservoir structure of claim 1, wherein the boundary seal components are formed of a material selected from the group consisting of an epoxy adhesive, an acrylate adhesive, a silicone sealant, a urethane sealant, and mixtures thereof.

10. The reservoir structure of claim 1, wherein the boundary seal components comprise a vacuum chuck to maintain contact between the flexible membrane and the reservoir.

11. The reservoir structure of claim 2, wherein the transparent window is formed of a material selected from the group consisting of glass, polyethylene terephthalate (PET), biaxially-oriented polyethylene terephthalate (BOPET), polymethylpentene (PMP), cyclic olefin copolymers (COC), polycarbonate, polymethylmethacrylate (PMMA), and mixtures thereof.

12. The reservoir structure of claim 2, wherein the transparent window has a thickness of about 0.1 mm to about 16 mm.

13. The reservoir structure of claim 1, wherein the compliant release layer is formed of a material selected from the group consisting of silicone, urethane, fluorinated polymers, and mixtures thereof.

14. The reservoir structure of claim 1, wherein the compliant release layer has a thickness of about 0.1 mm to about 13 mm.

15. The reservoir structure of claim 1, the aperture system further comprising a volume of gas or liquid between the flexible membrane and the compliant release layer.

16. The reservoir structure of claim 2, wherein the compliant release layer and transparent window are integrated and included in the lower opening as a single body.

17. A stereolithography device comprising:
a build platform;
the reservoir structure of claim 1 positioned below the build platform so that the build platform can be lowered into or raised out of the reservoir structure; and
an exposure source positioned below the reservoir structure and configured to emit a light that passes through the aperture system.

18. A reservoir structure for a bottom-up stereolithography device, the reservoir structure comprising:
a reservoir having a lower opening;
an aperture system comprising:
a flexible membrane positioned within the reservoir and covering the lower opening; and
a boundary seal positioned around a periphery of the flexible membrane, the boundary seal comprising one or more boundary seal components and immobilizing the periphery of the flexible membrane against the reservoir,
wherein the boundary seal comprises a resin exchange feature.

* * * * *